United States Patent [19]

Creeden

[11] Patent Number: 5,575,076
[45] Date of Patent: Nov. 19, 1996

[54] CIRCUIT BOARD TESTING FIXTURE WITH REGISTRATION PLATE

[75] Inventor: Joseph M. Creeden, Alto Loma, Calif.

[73] Assignee: Methode Electronics, Inc., Chicago, Ill.

[21] Appl. No.: 558,348

[22] Filed: Nov. 16, 1995

Related U.S. Application Data

[63] Continuation of Ser. No. 274,216, Jul. 13, 1994, abandoned.

[51] Int. Cl.$^6$ .................................................. G01D 21/00
[52] U.S. Cl. ............................................. 33/620; 324/758
[58] Field of Search .......................... 33/613, 614, 620, 33/645, 286; 324/754, 758, 761

[56] References Cited

U.S. PATENT DOCUMENTS

| | | | |
|---|---|---|---|
| 4,164,704 | 8/1979 | Kato et al. | 324/758 |
| 4,230,985 | 10/1980 | Matrone | 324/755 |
| 4,463,675 | 8/1984 | Moore | 33/614 |
| 4,771,234 | 9/1988 | Cook et al. | 324/758 |
| 4,774,462 | 9/1988 | Black | 324/758 |
| 4,834,659 | 5/1989 | Mang et al. | 439/55 |
| 5,222,305 | 6/1993 | Guth | 33/614 |

FOREIGN PATENT DOCUMENTS

0299232A1  6/1988  European Pat. Off. .

*Primary Examiner*—William A. Cuchlinski, Jr.
*Assistant Examiner*—G. Bradley Bennett
*Attorney, Agent, or Firm*—David L. Newman

[57] ABSTRACT

A test fixture is provided having a registration pattern, including holes and markings corresponding to the registration dimensions embedded in a board plate and a corresponding registration pattern in an intermediate plate wherein insertion of a registration pin through the appropriate registration pattern hole causes the intermediate plate to move accordingly in the direction and distance of the identified registration pattern hole, aligning the test pins of the test fixture to their desired position.

5 Claims, 2 Drawing Sheets

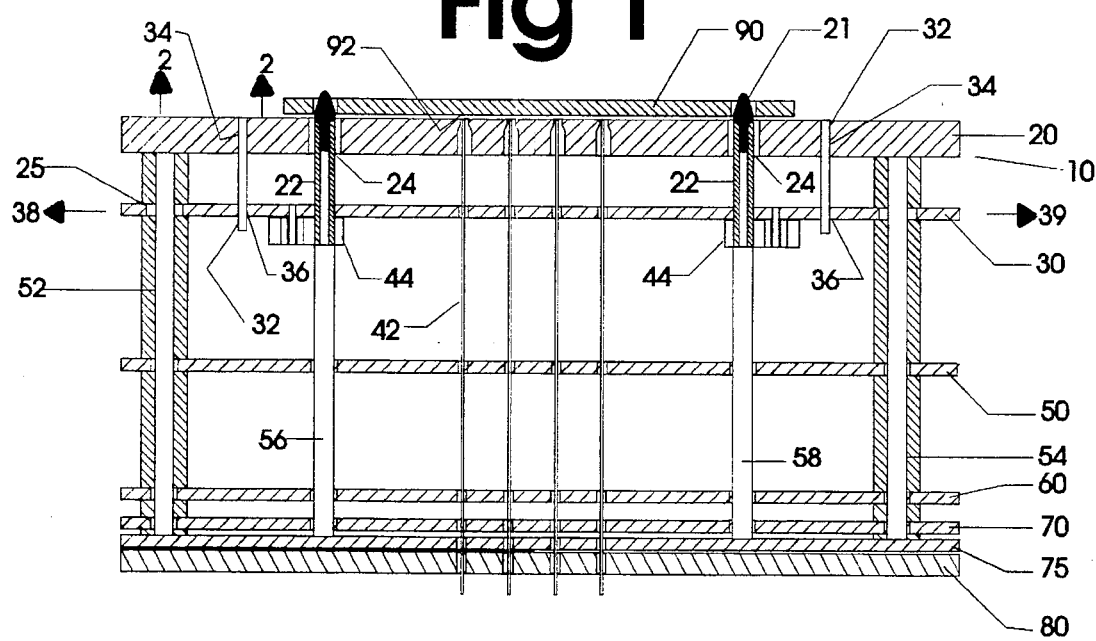

CIRCUIT BOARD TESTING FIXTURE WITH REGISTRATION PLATE

This is a continuation of application Ser. No. 08/274,216, filed Jul. 13, 1994 now abandoned.

BACKGROUND OF THE INVENTION

This a fixture for testing circuit boards and, in particular, a fixture including a plate having a registration pattern thereon.

Fixtures for testing printed circuit boards are common in the art and include drilled test points and tooling locations based on design criteria to correlate with the printed circuit board to be tested. The problem of tooling to pattern misregistration in test fixtures is a common problem in testing procedures. Misregistration occurs when the test points of a circuit board pattern do not register with the test points of the fixture designed according to CAD or Gerber design criteria, in conjunction with the multiple stage drilling operations that are required. Due to the continued miniaturization of circuit boards and due to the material growth of the circuit boards or shrinkage during processing, misregistration has become even more commonplace and detrimental to testing procedures. It is necessary to correct misregistration to avoid errors or opens. Under such misregistration, it is possible to have a network which is actually error free. However, due to the misregistration, pseudofaults will occur indicating that the circuit board is erred. This results in time-consuming, error-prone pseudofaults that can severely affect the test times and the costly "escapes." In prior fixtures misregistration was overcome by use of micrometers and building specialized fixtures to correlate with the printed circuit board to be tested. Such procedures were very costly and timely. Accordingly, there is needed a device which allows for the correction of the misregistration quickly and inexpensively.

It is therefore an object of the present invention to provide a testing fixture having a means for registering the fixture quickly and easily to a circuit board.

SUMMARY OF THE INVENTION

A testing fixture comprises a board plate and intermediate plate having a registration pattern thereon. The registration pattern provides for alignment of the intermediate plate to the board plate upon insertion of a registration pin in a registration pattern hole.

The board plate and intermediate plate have registration pattern holes therein for acceptance of a registration pin. The registration pattern holes of the intermediate plate are offset from the registration holes of the board plate according to the correspondingly marked registration pattern. The registration pattern provides for alignment of said intermediate plate in 45°, 90°, 135°, 225°, 270°315° and 360° increments. The registration pattern provides for alignment of the intermediate plate in 0.002 inch, 0.004 inch and 0.006 inch increments and combinations thereof. Two registration patterns are located in opposite corners of the board plate and two registration patterns are correspondingly located in two opposite corners of the intermediate plate.

A method of realigning a test fixture includes the steps of inserting a registration pin in a centered registration pattern hole, determining a misregistration measurement, loosening the test fixture so that an intermediate plate may move laterally, placing the registration pin in an appropriately marked registration pattern hole corresponding to the misregistration measurement, so that the intermediate plate is realigned according to the misregistration measurement.

These and other features of the invention are set forth below in the following detailed description of the presently preferred embodiments.

BRIEF DESCRIPTION OF THE DRAWINGS

FIG. 1 is a side elevation cut-away view of the testing fixture;

FIG. 2 is a top view of the registration pattern as taken at line 2—2 of FIG. 1.

DETAILED DESCRIPTION OF THE PRESENTLY PREFERRED EMBODIMENTS

Figure 3:
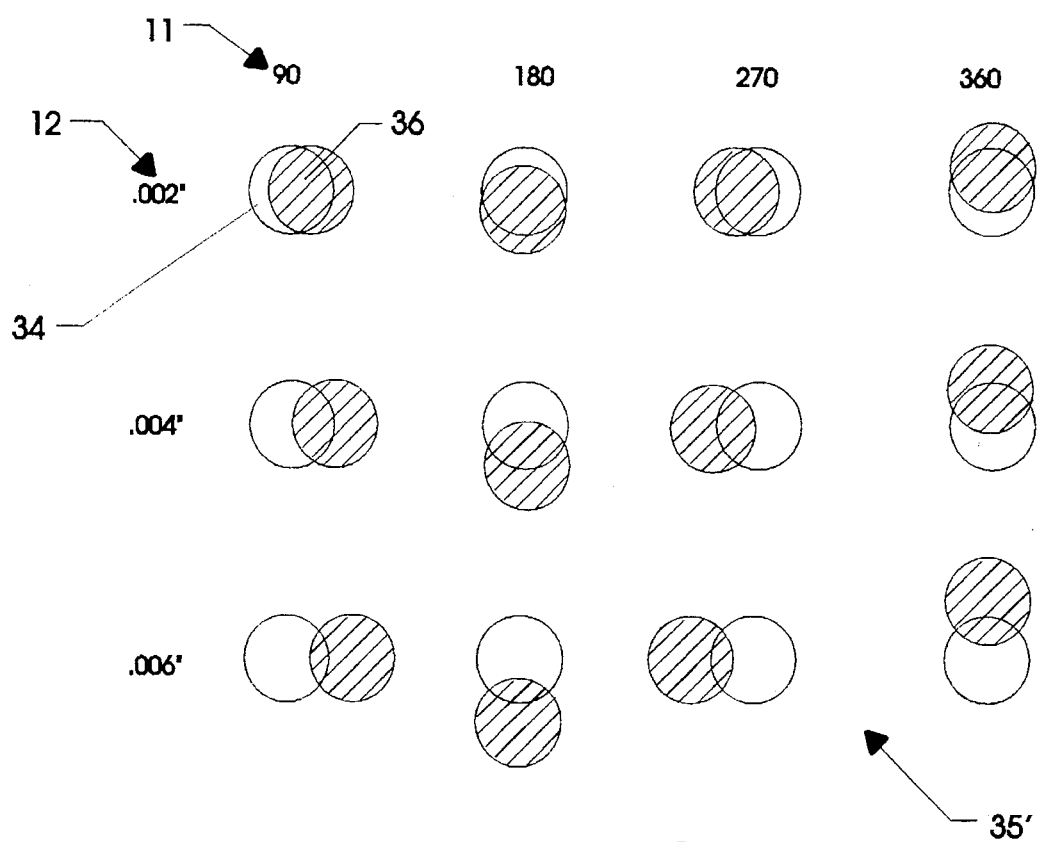
FIG. 3 is an enlarged view of FIG. 2 of the registration pattern of the present invention.

The present invention, as disclosed in FIG. 1, relates to a testing fixture 10 which includes a board plate 20, a first intermediate plate 30, a second intermediate plate 50, a third intermediate plate 60, a fourth intermediate plate 70, a fifth intermediate plate 75 and a grid plate 80. All of the aforementioned plates are interconnected via plate supports 52,54 and support spacers 56,58. Mated to the testing fixture 10 is a circuit board 90. The circuit board 90 is inserted over mounting pins 21,21 which are secured in tooling pin support 22,22 which are mounted in the first intermediate plate 30. The tooling pin supports 22 are secured to the first intermediate plate 30 by the tooling block 44 which provides perpendicularity to the tooling pin support to the board plate 20. Mounted within the testing fixture are test pins 42. Typically, a test fixture 10 may hold up to approximately 1,000 test pins 42.

The improvement of the present invention includes registration pin 32 which is located within registration pattern hole 34 of the board plate and registration pattern hole 36 of the first intermediate plate 30. The holes 34,36 are sized according to the diameter of the registration pin 32 so that the registration pin 32 may be frictionally secured within the holes 34,36. FIG. 1 illustrates a single registration pattern hole 34,36 for simplification. Multiple registration holes, however, are found in the preferred embodiment as illustrated in FIG. 2.

Upon mounting of the circuit board 90 on the mounting pins 21, the test pins 42 abut pads located on the surface 92 of the circuit board 90, adjacent the board plate 20. The test pins 42 form dimples on the pads of the printed circuit board 90. Upon perfect registration, the dimples will be centered on the pads. However, in a situation where misregistration occurs, the dimple is uncentered and can be measured from the center of the pad to determine a misregistration measurement. This measurement is taken while the registration pin 32 is located in the 0—0 registration pattern hole 31 (see FIG. 2). The 0—0 registration pattern hole 31 is centered. Upon determining the misregistration measurement, the registration pin 32 will be removed from the 0—0 registration hole 31. The plate supports 52,54 will be loosened by loosening screws in the plate supports 52,54 to enable the intermediate plates 30,50,60,70,75 and 80 to move freely, laterally or in the horizontal axis. According to the misregistration measurement, the registration pin 32 is then placed in the corresponding registration pattern hole of the board plate 20. The registration pattern holes of the board plate 20 are actually centered or aligned with the 0—0 registration pattern hole. However, the corresponding registration pattern holes of the first intermediate plate 30 are offset by the determined misregistration measurement. Upon insertion of the registration pin 32 through the registration pattern hole 34 of the board plate 20 and into the registration pattern hole 36 of the first intermediate plate 30, the first intermediate plate 30 will move in the direction and distance according to the determined misregistration measurement.

For example, if the misregistration occurred to the right; upon insertion of the registration pin 32 into the first intermediate plate 30 it will move in the direction of arrow 38 the designated distance to the left. If the misregistration measurement occurred to the left; upon insertion of the registration pin 32 into the first intermediate plate 30, it will move in the direction of arrow 39, the designated distance to the right. Moving simultaneously and in conjunction with the first intermediate plate 30, the tooling pin support 22 and test pins 42 will also move in the desired direction and distance, according to the misregistration measurement. Due to the broad board plate holes 24, the tooling pin support 22 may move without affecting the placement of the board plate 20. Likewise, the plate support hole 25 of the first intermediate plate 30 is larger than the holes of the other plates 30,50,60,70,75 and 80, to permit the first intermediate plate 30 to move laterally. After insertion of the registration pin 32, the screws of the plate supports 52,54 are tightened and the test fixture 10 is then secured in its newly registered position and any misregistration is overcome.

Turning to FIG. 2, the specific use of the registration pattern 35 is shown. FIG. 2 shows the actual registration pattern 35 and drilled holes which are used in the preferred embodiment. However, any registration pattern having any combination of holes or printed designations can be used. The registration pattern 35 and holes are placed onto the board plate and correspondingly to the first intermediate plate. The registration pattern 35 can be located on these plates in any location which is convenient. In the preferred embodiment, two registration patterns 35 are used in the opposite corners of the test fixture. The printed designations on the registration pattern 35 indicate the misregistration direction and distance that the test fixture is misregistered from the circuit board. The preferred registration pattern 35 allows registration pattern 35 also allows for registration by measurements of 0.002 inches, 0.004 inches and 0.006 inches, or any combination thereof.

For example, if upon measuring a dimple as being off from the Center of the pad 0.004 inches to the right or 90°; the registration pin will be inserted in hole 37. This hole 37 in the board plate will be centered or aligned to the 0—0 registration pattern hole 31. However, the corresponding hole 37 in the first intermediate plate will be offset from the hole above it in the board plate by 0.004 inches to the right or 90°. Thus, by inserting the registration pin through both holes 37 of the board plate and the intermediate plate, the intermediate plate will then be aligned 0.004 inches to the right and the test pins will then align with the centers of the pads of the circuit board mated to the test fixture. In another example, if the misregistration measurement is 0.006 inches in the X direction and 0.002 inches in the Y direction and are off 225°; the registration pin will be inserted in registration pattern hole 33. Insertion of the registration pin within hole 33 of the intermediate plate, will cause the intermediate plate to move 0.006 inches in the X direction and 0.002 inches in the Y direction at an angle of 225° from the center of the pad. Any misregistration measurements which are greater or less than the measurements 0.002 inches, 0.004 inches and 0.006 inches must be rounded up or down according to the particularly designated registration pattern 35. More precise registration patterns may be used. However, it has been found that the degree of realignment provided by the preferred registration pattern 35, as is shown in FIG. 2, is sufficient to avoid any pseudofaults or errors.

FIG. 3 is an enlarged partial view of the registration pattern holes of FIG. 2. It should be noted that the drawing of FIG. 3 is exaggerated so that the offset between the board plate holes and the intermediate plate holes may be more clearly viewed. FIG. 3 is a partial view of FIG. 2 showing only the first twelve holes of the registration pattern of FIG. 2 enlarged. Again, the registration pattern offsets provided in FIGS. 2 and 3 are the preferred offsets as they are the most commonly required in order to realign the test fixture, however, any direction or distance of offsets may be used as a registration pattern for this invention.

FIG. 3 discloses partial registration pattern 35' which includes registration pattern hole 34 of the board plate and registration pattern hole 36 of the first intermediate plate. In this view, the plates themselves are not shown but would be in separate planes as shown in FIG. 1. All holes shown shaded, such as hole 36 are in the intermediate plate and the non-shaded holes, such as hole 34 are in the board plate. The registration pattern 35' includes printed designations indicated by arrow 11 to designate misregistration direction and printed designations indicated by arrow 12 to indicate misregistration distance, similar to the designations of FIG. 2. The preferred partial registration pattern 35' allows for registration alignment in 90°, 180°, 270°, and 360°; and also allows for registration alignment by measurements of 0.002 inches, 0.004 inches and 0.006 inches, or any combination thereof. For example, if upon measuring a dimple as being off from the center of the pad 0.002 inches to the right or 90°; the registration pin will be inserted in registration pattern hole 34. Hole 34 in the board plate is centered or aligned to the 0—0 registration pattern hole 31 (see FIG. 2). However, the corresponding registration pattern hole 36 in the first intermediate plate is offset from hole 34 by 0.002 inches to the right or 90° (for purposes of illustration, the drawing in FIG. 3 has been exaggerated so that the hole 36 is actually offset from hole 34 by more than 0.002 inches). Thus, by inserting the registration pin through hole 34 of the board plate and hole 36 of the intermediate plate, the intermediate plate will then be aligned 0.002 inches to the right and the test pins will then align with the centers of the pad of the circuit board mated to the test fixture. It should be understood by the illustration of FIG. 3 that the other registration holes of the intermediate plate as shown in the partial registration pattern 35' are offset to differing directions and by different distances and will cause the intermediate plate to be realigned accordingly.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

What is claimed is:

1. A test fixture having multiple plates having test pin apertures for holding an array of test pins therein and separate from said test pin apertures are registration holes providing for realignment of an intermediate plate according to a misregistration measurement designated by a registration pattern, the test fixture comprising:

a board plate having a first pattern of registration holes therein;

an intermediate plate having a second pattern of registration holes therein corresponding to said registration holes of said first pattern;

a registration pin received by said first and second pattern of registration holes; and each individual second pattern registration hole is offset by a predetermined distance and angle from each corresponding individual first pattern registration hole according to said misregistration measurement, wherein insertion of said registration pin through said first pattern registration hole and said corresponding second pattern registration hole causes said intermediate plate to be realigned according to said misregistration measurement.

2. The test fixture of claim 1 wherein each said individual second pattern registration hole has a different combination of offset distance and angle to each other said individual second pattern registration hole.

3. The test fixture of claim 1 wherein:

said registration pattern provides for alignment of said intermediate plate in 45°, 90°, 135°, 225°, 270°, 315°, and 360° increments.

4. The test fixture of claim 1 wherein:

said registration pattern provides for alignment of said intermediate plate in 0.002 inch, 0.004 inch and 0.006 inch increments.

5. The test fixture of claim 1 wherein:

two registration patterns are located in opposite corners of said board plate and two registration patterns are correspondingly located in said opposite corners of said intermediate plate.

* * * * *